United States Patent [19]

Koury, Jr. et al.

[11] Patent Number: 4,730,278

[45] Date of Patent: Mar. 8, 1988

[54] CIRCUIT FOR CHARGING AND DISCHARGING A ROW OF MEMORY CELLS

[75] Inventors: Daniel N. Koury, Jr., Scottsdale; Walter C. Seelbach, Fountain Hills, both of Ariz.

[73] Assignee: Motorola, Inc., Schaumburg, Ill.

[21] Appl. No.: 914,957

[22] Filed: Oct. 3, 1986

[51] Int. Cl.[4] .................. G11C 11/36; G11C 7/00; H03K 3/01

[52] U.S. Cl. .................. 365/203; 365/189; 365/175; 307/296 R

[58] Field of Search .............. 365/203, 174, 175, 189, 365/230; 307/296 R, 544, 549

[56] References Cited

U.S. PATENT DOCUMENTS 4,520,462  5/1985  Yamada et al. .................. 365/203
4,567,381  1/1986  Piasecki ........................ 365/203

OTHER PUBLICATIONS

Toyoda et al., "A High Speed 16 Kbit ECL RAM", IEEE Journal of Solid State Circuits, vol. sc-18, No. 5, Oct. 1983, pp. 510-511.

Primary Examiner—Terrell W. Fears
Assistant Examiner—Melissa T. Koval
Attorney, Agent, or Firm—William E. Koch

[57] ABSTRACT

A circuit is described that provides a quick charge and discharge of a row of memory cells. A first transistor has its collector-emitter path coupled between a first voltage and a row of memory cells, and a base coupled to an input terminal. A second transistor has its collector-emitter path coupled to the first voltage by a resistor and to a voltage level setting device, and a base coupled to the input terminal. A third transistor has its collector-emitter path coupled between the row of memory cells and a second voltage, and a base coupled to a voltage level shifting device. As the row of memory cells are selected, the third transistor becomes less conductive, thereby sinking less current from the row of memory cells and allowing the inherent capacitance of the row of memory cells to charge more quickly. As the row of memory cells are deselected, the third transistor becomes more conductive, thereby sinking more current from the row of memory cells and discharging the inherent capacitance more quickly.

1 Claim, 1 Drawing Figure

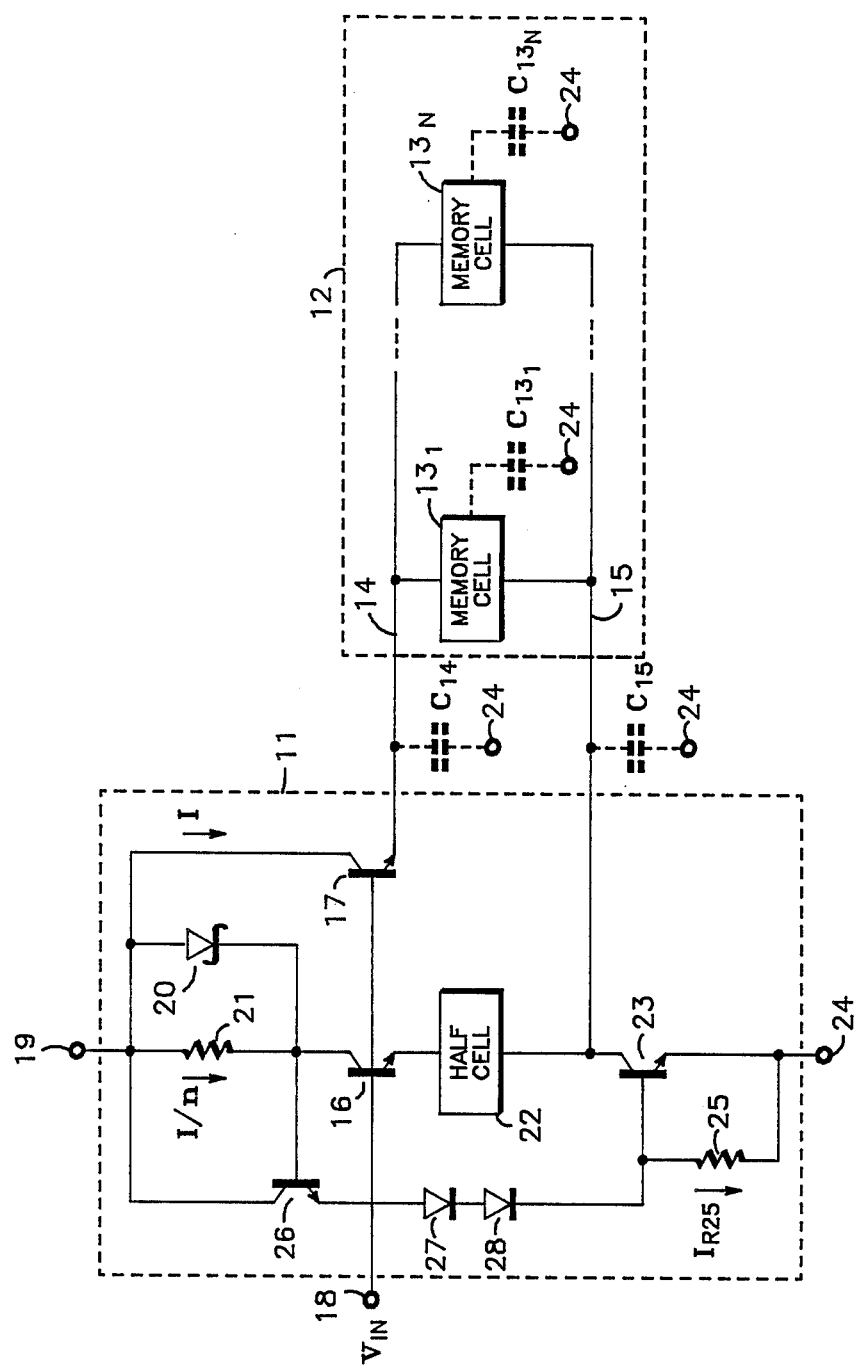

CIRCUIT FOR CHARGING AND DISCHARGING A ROW OF MEMORY CELLS

FIELD OF THE INVENTION

The present invention generally relates to a bipolar circuit for quickly charging and discharging a row of memory cells.

BACKGROUND OF THE INVENTION

Circuits for charging and discharging a capacitive load are perverse in the art. However, there always seems to be a need for a circuit that will charge and discharge a capacitive load more quickly or with less power than those circuits known in the art. This is especially true when the load is a memory cell of a monolithically integrated memory cell array.

Memory cells are circuits wherein information may be stored in a low current stand-by mode and may be written or read in a higher current mode. A predetermined number of cells are located in a row between each of a plurality of upper and lower word lines and another predetermined number of cells are located in a column between a plurality of bit lines. In other words, each cell is uniquely coupled between a combination of word lines and bit lines.

Conventionally, a row of cells is selected when increased voltage is supplied to the upper word line by a row selection circuit. A particular cell in that row is read by a sense amplifier coupled to the bit lines. A first read current through one bit line flows directly from the sense amplifier. A second read current through the other bit line flows through one side of the memory cell from the upper word line. When a cell is written, the first read current is directed through the cell and the second read current is directed from the sense amplifier.

A stand-by current source is coupled between the lower word line and a second voltage terminal for sinking current from the selected row of memory cells. However, this standby current source provides a very small current in order to minimize total current requirements of the array. Therefore, the time to deselect the cell is very lengthy.

One well known improvement on the above conventional circuit comprises having each lower word line connected to the anode of a diode. A kicker current source is coupled between the cathode of a selected diode and the second voltage terminal. The kicker current source carries a larger current than the stand-by current source, i.e., ten times as large, and provides for a much quicker sink of current from the lower word line. The diode typically comprises a transistor having its base coupled to its collector. However, these diodes create an inherent capacitance, i.e., base-emitter diffusion capacitance, that the kicker current source must discharge in addition to sinking current from the lower word line. While one row is being deselected, another row is being selected. The kicker current source will switch from the cell being deselected to the memory cell being selected as the magnitude of the word line voltages cross, thereby slowing down the deselection process.

Another known improvement is disclosed in "A High Speed 16 kbit ECL RAM", *IEEE JOURNAL OF SOLID-STATE CIRCUITS*, Vol. SC-18, No. 5, October 1983. A first transistor is coupled between the lower word line and the kicker current source (in place of the diode of the above described circuit). The base of the first transistor is coupled to a resistor-capacitor (RC) network. A second transistor has its base coupled to the upper word line and supplies current to the RC network. An additional current source is coupled between the RC network of each upper word line and a second supply voltage terminal. The charge from the RC network keeps the first transistor on longer after deselection of the cell, thereby providing a quicker reduction of the voltage of the lower word line. Also, the RC network will keep the first transistor off longer after selection of the cell, providing for a quicker increase of the voltage of the going high lower word line, and also preventing the first transistor from robbing the kicker current from the lower word line being deselected. However, this circuit requires the additional second transistor for each row of cells and the additional current source, thereby consuming valuable space on the array's integrated circuit. Also, the additional current source increases the power requirements of the array significantly. Another known circuit substitutes a diode for the second transistor of the just described circuit and includes a diode coupled between the lower word line and the kicker current source. However, this circuit suffers the same deficiencies of the previously described circuit.

A circuit similar to the present invention, also assigned to Assignee of the present invention, is found in pending Application Ser. No. 815,846, wherein a transient driver circuit for use with a logic circuit has an emitter-follower output stage that sources current to a load connected to an output thereof in response to an applied logic signal being at a first logic level. The transient driver circuit includes a first NPN transistor having a collector-emitter path coupled between the output of the logic circuit and the negative power supply rail. A second NPN transistor has its collector-emitter path couple between a positive power supply rail and the collector of the first NPN transistor and its base adapted to receive the logic signal. Feedback circuitry, that is responsive to a rise in the collector voltage of the second NPN transistor occurring as the logic signal switches to a second logic level, transfers this rising voltage to the base of the first NPN transistor, thereby turning it on harder to sink a large transient current at the output of the logic circuit. This circuit cannot be used as described to charge and discharge a row of memory cells.

Thus, what is needed is an improved bipolar circuit for charging and discharging a capacitive load, i.e., a memory word line selection circuit and word line pulldown circuit that provides either a quicker discharge, or a discharge requiring less power than previously known, of the word line of a row of memory cells.

SUMMARY OF THE INVENTION

Accordingly, it is an object of the present invention to provide an improved bipolar circuit for charging and discharging a row of memory cells.

Another object of the present invention is to provide an improved circuit that provides a quick discharge of the word line of an array of memory cells.

A further object of the present invention is to provide an improved circuit that consumes less power while discharging a row of memory cells.

In carrying out the above and other objects of the invention in one form, there is provided a circuit that comprises a first transistor having its collector-emitter path coupled between a first voltage and a row of memory cells, and a base coupled to an input terminal. A second transistor has its collector-emitter path coupled to the first voltage by a resistor and to a voltage level setting device, and a base coupled to the input terminal. A third transistor has its collector-emitter path coupled between the row of memory cells and a second voltage, and a base coupled to a voltage level shifting device. As the row of memory cells are selected, the third transistor becomes less conductive, thereby sinking less current from the row of memory cells and allowing the inherent capacitance of the row of memory cells to charge more quickly. As the row of memory cells are deselected, the third transistor becomes more conductive, thereby sinking more current from the row of memory cells and discharging the inherent capacitance more quickly.

The above and other objects, features, and advantages of the present invention will be better understood from the following detailed description taken in conjunction with the accompanying drawing.

BRIEF DESCRIPTION OF THE DRAWING

The single FIGURE is a schematic of the present invention.

DETAILED DESCRIPTION OF THE INVENTION

Referring to the single FIGURE, the circuit 11 for quickly charging and discharging a row of memory cells 12 is shown which is suitable to be fabricated in monolithic integrated circuit form. The row of memory cells 12 comprises memory cells $13_1$ through $13_N$ coupled between word line 14 and current drain line 15, where N is any positive integer greater than 1. Memory cells $13_1$ through $13_N$ may comprise any one of a number of memory cells known in the art.

NPN transistors 16 and 17 have their bases connected to input terminal 18 for receiving input signal $V_{IN}$. Input signal $V_{IN}$ is a digital signal comprising either a high or low voltage state. Transistor 17 has a collector connected to voltage terminal 19 and an emitter coupled to word line 14. Transistor 16 has a collector coupled to voltage terminal 19 by resistor 21 and an emitter coupled to current drain line 15 by voltage level setting circuit 22. Resistor 21 may optionally be clamped by Schottky diode 20 to prevent transistor 16 from entering hard saturation in case of high currents through resistor 21 due to transients or power supply variations. Voltage level setting circuit 22 ideally will have a voltage drop equal to the voltage drop between word line 14 and current drain line 15, and may actually comprise a "half memory cell" (that portion of the selected memory cell of the row of memory cells 12). Current source transistor 23 has a collector connected to current drain line 15, an emitter coupled to voltage terminal 24 and a base coupled to a voltage level shifting device here shown as resistor 25 and diodes 27 and 28. Feedback transistor 26 has a collector connected to voltage terminal 19, an emitter coupled to the base of transistor 23 by the voltage level shifting device, and a base connected to the collector of transistor 16. Transistor 26 and diodes 27 and 28 provide a feedback path during transient switching conditions to render transistor 23 more conductive to provide a large transient current therethrough as will be more fully explained hereinafter. Resistor 25 establishes a bias current in transistor 26 and diodes 27 and 28 to lower the impedance of the feedback path between the collector of transistor 16 and the base of transistor 23. The current path comprising diodes 27 and 28 may comprise additional semiconductor devices, serving the purpose of setting the voltage level on the base of transistor 23.

In a quiescent operating state, when input signal $V_{IN}$ is in the high state, a current I flows from transistor 17 to memory cells $13_1$–$13_N$. Due to the current mirror arrangement of transistors 16 and 17 and if transistors 16 and 17 have equal emitter areas, current I will also flow through transistor 16. However, for the invention described in the single FIGURE, the emitter area of transistor 17 is n times larger than the area of transistor 16, where n is a positive integer. Thus, a quiescent current equal to I/n flows through transistor 16. The base-emitter voltage drop of transistor 23 is applied across resistor 25 and sets the quiescent value of the current supplied through transistor 26. Hence, the total quiescent current flow through circuits 11 and 12 is equal to:

$$I_Q = I(1 + 1/n) + I_{R25}$$

where I is the standby current for the memory cells and $I/n + I_{R25}$ is required by circuit 11.

One of the major problems associated with selecting a row of memory cells is the charging and discharging the inherent or distributed capacitances $C_{14}$, $C_{15}$ and $C_{13}$ of the word line 14, current drain line 15 and each of the memory cells $13_1$–$13_N$, respectively. Circuit 11 provides a method for quickly charging and discharging these capacitances as described hereinafter.

In operation, when a rising edge is applied to input terminal 18, transistors 16 and 17 are rendered exponentially more conductive. This transient current flowing through transistor 17 charges capacitances $C_{14}$, $C_{15}$, $C_{13}$ until word line 14 and current drain line 15 have been raised in voltage by the same amount as input voltage $V_{IN}$, at which point the circuit returns to its quiescent operating condition. At the same time, the increased current through transistor 16 results in a greater voltage drop across resistor 21 and a falling signal to the base of transistor 26. This falling edge is transferred to the base of transistor 23, rendering it temporarily less conductive until the current in transistor 16 returns to the steady state value. This prevents transistor 23 from drawing current through the memory cells 12 which could otherwise be used to charge the capacitances.

When a falling edge is applied as input signal $V_{IN}$ to input terminal 18, transistors 16 and 17 are temporarily rendered much less conductive due to the high capacitance at the emitter of transistor 17. This causes the base of transistor 26 to rise towards the supply voltage at terminal 19. This rising edge is then transferred to transistor 23 which is rendered exponentially more conductive. This increased current through transistor 23 discharges capacitances $C_{14}$, $C_{15}$, $C_{13}$ at word line 14, current drain line 15, and memory cells $13_1$ through $13_N$ until the voltages at word line 14 and current drain line 15 have fallen with input signal $V_{IN}$. Note that the quiescent currents are the same for both a high and a low input, although the voltages are shifted somewhat.

By now it should be appreciated that there has been provided a circuit for quickly charging and discharging a row of memory cells.

We claim:

1. A circuit for quickly discharging a memory cell in a row of memory cells, said circuit comprising:

an input terminal coupled for receiving a digital input signal having a high state and a low state;

first means coupled to said input terminal and coupled between a first voltage source and said memory cells for selectively supplying current to said memory cell in response to said input signal;

a first transistor having its collector-emitter path coupled between said memory cells and a second voltage source having a base;

second means coupled to said first voltage source for providing a voltage level below that of said first voltage source;

third means coupled to a first node between said collector-emitter path of said first transistor and said memory cells for providing a load similar in resistance to said memory cell;

a second transistor having its collector-emitter path coupled between said second and third means, and a base coupled to said input terminal;

fourth means coupled to said base of said first transistor for setting the voltage level at said base of said first transistor; and a third transistor having its collector-emitter path coupled between said first voltage source and said fourth means and a base coupled to a second node between said second means and said collector-emitter path of said second transistor, wherein said second transistor becomes more conductive when said input signal is in said high state, causing said third and first transistors to become less conductive and causing said first means to charge said memory cell, and said second transistor becomes less conductive when said input signal is in said low state, causing said third and first transistor to become more conductive, thereby causing said memory cells to discharge.

* * * * *